(12) United States Patent
Eloranta et al.

(10) Patent No.: US 7,345,612 B2
(45) Date of Patent: Mar. 18, 2008

(54) DIGITAL-TO-RADIO FREQUENCY CONVERSION DEVICE, CHIP SET, TRANSMITTER, USER TERMINAL AND DATA PROCESSING METHOD

(75) Inventors: Petri Tapani Eloranta, Espoo (FI); Pauli Mikael Seppinen, Espoo (FI)

(73) Assignee: Nokia Corporation, Espoo (FI)

( * ) Notice: Subject to any disclaimer, the term of this patent is extended or adjusted under 35 U.S.C. 154(b) by 0 days.

(21) Appl. No.: 11/348,837

(22) Filed: Feb. 7, 2006

(65) Prior Publication Data

US 2007/0182617 A1 Aug. 9, 2007

(51) Int. Cl.
*H03M 1/66* (2006.01)
(52) U.S. Cl. .................................. 341/153; 341/144
(58) Field of Classification Search ................ 341/133, 341/136, 141, 144, 153
See application file for complete search history.

(56) References Cited

U.S. PATENT DOCUMENTS

| | | | |
|---|---|---|---|
| 5,059,977 A * | 10/1991 | Herman et al. | 341/144 |
| 5,600,321 A * | 2/1997 | Wincn | 341/144 |
| 2005/0074073 A1 | 4/2005 | Yuan et al. | |
| 2005/0111573 A1 | 5/2005 | Shakeshaft et al. | |
| 2005/0162294 A1* | 7/2005 | Norsworthy et al. | 341/136 |
| 2005/0191976 A1 | 9/2005 | Shakeshaft et al. | |
| 2005/0225464 A1* | 10/2005 | Lin et al. | 341/144 |
| 2006/0061499 A1* | 3/2006 | Seo | 341/144 |
| 2006/0139197 A1* | 6/2006 | Schoner | 341/144 |

FOREIGN PATENT DOCUMENTS

| | | |
|---|---|---|
| JP | 03242024 A * | 10/1991 |
| WO | 02/067445 | 8/2002 |

OTHER PUBLICATIONS

Zhou et al., "A Highly Integrated CMOS Direct Digital RF Quadrature Modulator", Competence Center for Circuit Design Department of Electroscience, Lund University, Sweden, IEEE 2003, pp. 573-576, 2003.

* cited by examiner

*Primary Examiner*—Howard L. Williams
(74) *Attorney, Agent, or Firm*—Hollingsworth & Funk, LLC (57) ABSTRACT

The invention relates to a device for digital-to-radio frequency conversion, the device comprising: conversion cell matrices for digital-to-radio frequency conversion; means for providing a digital data signal; means for dividing the digital data signal into data signal groups; means for generating clock signals, the clock signals having different phases, the number of clock signals being the same as the number of data signal groups; means for synchronizing the data signal groups by using the clock signals; means for conveying the synchronized data signal groups to the conversion cell matrices, the number of conversion cell matrices being the same as the number of data signal groups; and means for synchronizing each conversion cell matrix by using the clock signal with which the synchronized data signal group conveyed thereto was synchronized for generating interpolation values.

34 Claims, 3 Drawing Sheets

PRIOR ART

FIG. 3

PRIOR ART

DIGITAL-TO-RADIO FREQUENCY CONVERSION DEVICE, CHIP SET, TRANSMITTER, USER TERMINAL AND DATA PROCESSING METHOD

FIELD

The invention relates to a digital-to-radio frequency (RF) conversion device, a chip set, a transmitter, a user terminal and a data processing method.

BACKGROUND

In modern wireless communications systems, the target to make more cost efficient and less power consuming devices has led to a need to increase integration level. The integration level can be increased, for instance, by using a conversion device which combines both a digital-to-analog converter and a mixer. This kind of a conversion device can offer digital-to-analog conversion in association with radio frequency generation.

In the direct digital-to-radio frequency (RF) conversion described above, interfering image components are generated into a spectrum due to sampling carried out in digital-to-analog (D/A) conversion. In the prior art, these image components are attenuated by a filter placed after the D/A conversion. The filters, however, make the structure of a converter more complicated.

BRIEF DESCRIPTION OF THE INVENTION

According to an aspect of the invention, there is provided a device for digital-to-radio frequency conversion, the device comprising: conversion cell matrices for digital-to-radio frequency conversion; means for providing a digital data signal; means for dividing the digital data signal into data signal groups; means for generating clock signals, the clock signals having different phases, the number of clock signals being the same as the number of data signal groups; means for synchronizing the data signal groups by using the clock signals; means for conveying the synchronized data signal groups to the conversion cell matrices, the number of conversion cell matrices being the same as the number of data signal groups; and means for synchronizing each conversion cell matrix by using the clock signal with which the synchronized data signal group conveyed thereto was synchronized for generating interpolation values.

According to another aspect of the invention, there is provided a data processing method in a communication device, the method comprising: providing a digital data signal; dividing the digital data signal into data signal groups; generating clock signals, the clock signals having different phases, the number of clock signals being the same as the number of data signal groups; synchronizing the data signal groups by using the clock signals; conveying the synchronized data signal groups to conversion cell matrices, the number of conversion cell matrices being the same as the number of data signal groups; synchronizing each conversion cell matrix by using the clock signal with which the synchronized data signal group conveyed thereto was synchronized for generating interpolation values; and converting the digital data signal to an analog signal by using the conversion matrices.

According to another aspect of the invention, there is provided a chip set for digital-to-radio frequency conversion, the chip set comprising: conversion cell matrices for digital-to-radio frequency conversion; means for providing a digital data signal; means for dividing the digital data signal into data signal groups; means for generating clock signals, the clock signals having different phases, the number of clock signals being the same as the number of data signal groups; means for synchronizing the data signal groups by using the clock signals; means for conveying the synchronized data signal groups to the conversion cell matrices, the number of conversion cell matrices being the same as the number of data signal groups; and means for synchronizing each conversion cell matrix by using the clock signal with which the synchronized data signal group conveyed thereto was synchronized for generating interpolation values.

According to another aspect of the invention, there is provided a transmitter for digital-to-radio frequency conversion, the transmitter comprising: conversion cell matrices for digital-to-radio frequency conversion; means for providing a digital data signal; means for dividing the digital data signal into data signal groups; means for generating clock signals, the clock signals having different phases, the number of clock signals being the same as the number of data signal groups; means for synchronizing the data signal groups by using the clock signals; means for conveying the synchronized data signal groups to the conversion cell matrices, the number of conversion cell matrices being the same as the number of data signal groups; and means for synchronizing each conversion cell matrix by using the clock signal with which the synchronized data signal group conveyed thereto was synchronized for generating interpolation values.

According to another aspect of the invention, there is provided a user terminal for digital-to-radio frequency conversion, the user terminal comprising: conversion cell matrices for digital-to-radio frequency conversion; means for providing a digital data signal; means for dividing the digital data signal into data signal groups; means for generating clock signals, the clock signals having different phases, the number of clock signals being the same as the number of data signal groups; means for synchronizing the data signal groups by using the clock signals; means for conveying the synchronized data signal groups to the conversion cell matrices, the number of conversion cell matrices being the same as the number of data signal groups; and means for synchronizing each conversion cell matrix by using the clock signal with which the synchronized data signal group conveyed thereto was synchronized for generating interpolation values.

According to another aspect of the invention, there is provided a device for digital-to-radio frequency conversion, the device comprising: conversion cell matrices for digital-to-radio frequency conversion; the device configured to: provide a digital data signal; divide the digital data signal into data signal groups; generate clock signals, the clock signals having different phases, the number of clock signals being the same as the number of data signal groups; synchronize the data signal groups by using the clock signals; convey the synchronized data signal groups to the conversion cell matrices, the number of conversion cell matrices being the same as the number of data signal groups; and synchronize each conversion cell matrix by using the clock signal with which the synchronized data signal group conveyed thereto was synchronized for generating interpolation values.

According to another aspect of the invention, there is provided a chip set for digital-to-radio frequency conversion, the chip set comprising: conversion cell matrices for digital-to-radio frequency conversion; the chip set configured to: provide a digital data signal; divide the digital data signal into data signal groups; generate clock signals, the clock signals having different phases, the number of clock signals being the same as the number of data signal groups; synchronize the data signal groups by using the clock signals; convey the synchronized data signal groups to the conversion cell matrices, the number of conversion cell matrices being the same as the number of data signal groups; and synchronize each conversion cell matrix by using the clock signal with which the synchronized data signal group conveyed thereto was synchronized for generating interpolation values.

According to another aspect of the invention, there is provided a transmitter for digital-to-radio frequency conversion, the transmitter comprising: conversion cell matrices for digital-to-radio frequency conversion; the transmitter configured to: provide a digital data signal; divide the digital data signal into data signal groups; generate clock signals, the clock signals having different phases, the number of clock signals being the same as the number of data signal groups; synchronize the data signal groups by using the clock signals; convey the synchronized data signal groups to the conversion cell matrices, the number of conversion cell matrices being the same as the number of data signal groups; and synchronize each conversion cell matrix by using the clock signal with which the synchronized data signal group conveyed thereto was synchronized for generating interpolation values.

According to another aspect of the invention, there is provided a user terminal for digital-to-radio frequency conversion, the user terminal comprising: conversion cell matrices for digital-to-radio frequency conversion; the user terminal configured to: provide a digital data signal; divide the digital data signal into data signal groups; generate clock signals, the clock signals having different phases, the number of clock signals being the same as the number of data signal groups; synchronize the data signal groups by using the clock signals; convey the synchronized data signal groups to the conversion cell matrices, the number of conversion cell matrices being the same as the number of data signal groups; and synchronize each conversion cell matrix by using the clock signal with which the synchronized data signal group conveyed thereto was synchronized for generating interpolation values.

The invention provides several advantages.

An embodiment of the invention provides a conversion device with a higher integration level compared with prior art conversion devices.

LIST OF DRAWINGS

In the following, the invention will be described in greater detail with reference to embodiments and the accompanying drawings, in which.

DESCRIPTION OF EMBODIMENTS

Figure 1:
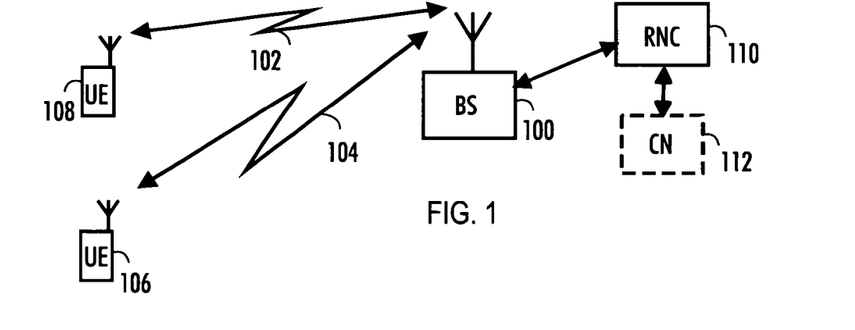
FIG. 1 shows an example of a communications system.

With reference to FIG. 1, we examine an example of a communications system to which embodiments of the invention can be applied. The present invention can be applied to communications systems offering HSDPA services. One example of such a communications system is a Universal Mobile Telecommunications System (UMTS) radio access network (UTRAN). It is a radio access network which includes wideband code division multiple access (WCDMA) technology and can also offer real-time circuit and packet switched services. The embodiments are not, however, restricted to the systems given as examples but a person skilled in the art may apply the solution to other communications systems provided with the necessary properties.

FIG. 1 is a simplified illustration of a data transmission system (a communications system) to which embodiments according to the invention are applicable. This is a part of a cellular radio system which comprises a base station (or node B) 100, which has bi-directional radio links 102 and 104 to user devices 106 and 108. The user devices may be fixed, vehicle-mounted or portable. The base station includes transceivers, for instance. From the transceivers of the base station, a connection is provided to an antenna unit that establishes bi-directional radio links to the user devices. The base station is further connected to a controller 110, a radio network controller (RNC), which transmits the connections of the devices to other parts of the network. The radio network controller controls in a centralized manner several base stations connected thereto. The radio network controller is further connected to a core network 112 (CN). Depending on the system, the counterpart on the CN side can be a mobile services switching centre (MSC), a media gateway (MGW) or a serving GPRS (general packet radio service) support node (SGSN), etc.

It should be noticed that in future radio networks, the functionality of an RNC may be distributed among (possibly a subset of) base stations.

The communications system is also able to communicate with other networks, such as a public switched telephone network or the Internet.

Figure 2:
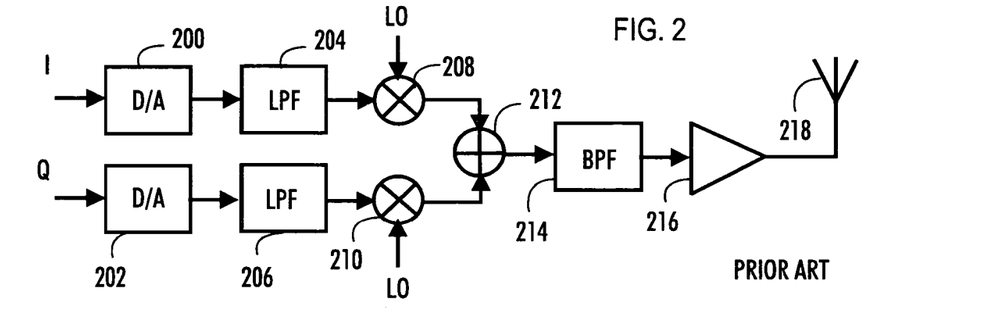
FIG. 2 illustrates an example of a direct conversion transmitter.

FIG. 2 shows an example of a prior art direct conversion transmitter, in other words, a transmitter which includes a conversion device offering digital-to-analog conversion associated with radio frequency (RF) generation. The transmitter is used for producing in-phase (I) and quadrature (Q) signals which are orthogonal in relation to each other. Two orthogonal signals produce a complex waveform.

As can be seen in FIG. 2, both signal components need a digital-to-analog (D/A) converter 200, 202 of their own. Analog signals are lowpass-filtered in blocks 204, 206 to filter out image components.

An embodiment of the invention comprises no low pass filters.

Filtered signals are then multiplied with carrier wave components (called mixing or up-conversion) in multipliers 208, 210. In adder 212, 1 and Q signals are added so as to perform one signal. The signal is band pass filtered with filter 214 and conveyed to power amplifier 216 for transmitting via antenna or antenna group 218.

The digital-to-RF conversion according to an embodiment of the invention is based on conversion cells. The concept of conversion cells is briefly explained by using the example of FIG. 3. Conversion cells are known in the prior art.

Figure 3:
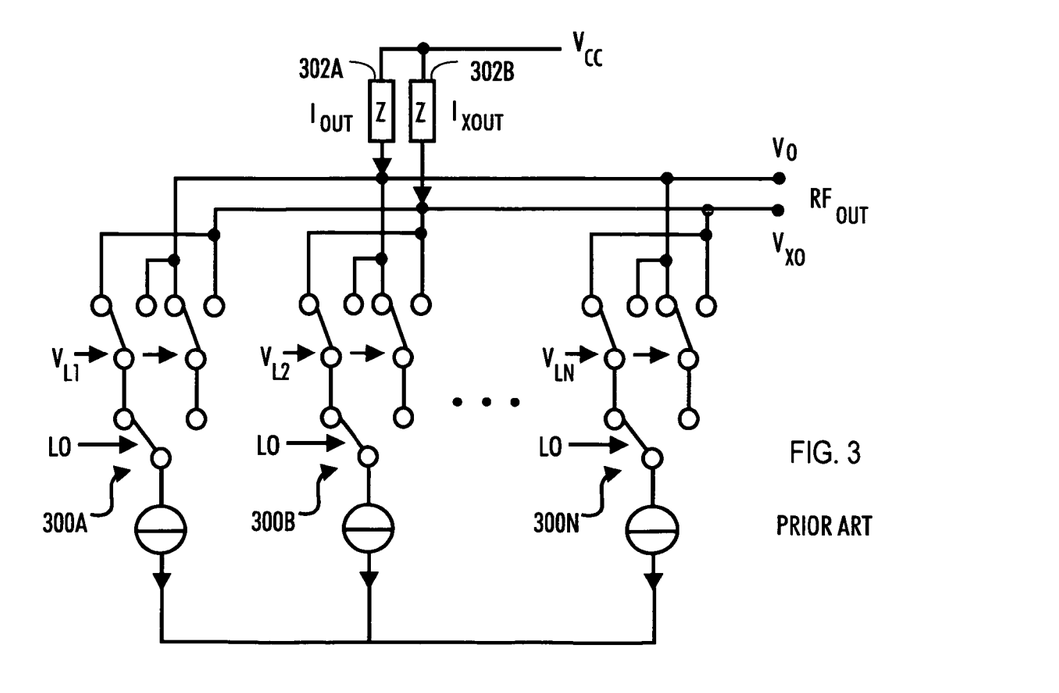
FIG. 3 illustrates an example of conversion cells.

In the example of FIG. 3, a plurality of conversion cells 300A-300N are provided. The number of conversion cells may vary. The conversion cells are a part of an upconverter. Typically, the configuration is segmented: separate blocks for least significant bits (LSB) and most significant bits (MSB) are provided, which blocks are not marked in FIG. 3.

The current in the LSB sub-block is typically generated with parallel binary weighted units, whereas the current in the MSB sub-block is generated in a set of unary coded cells.

Two current paths for conveying differential currents, $I_{out}$ and $I_{xout}$, are provided in order to perform an output signal, $RF_{out}$, by using external or internal loads 302A, 302B. The output signal is provided at two terminals, marked as voltages $V_o$ and $V_{xo}$.

Upconversion is carried out by applying a carrier signal, marked LO (local oscillator) in FIG. 3, from a local oscillator to each of the conversion cells 300A-300N which are double-balanced digital mixers including a differential data switch section connected in series with a differential local oscillator switch pair and a current source. $V_{CC}$ is a power supply voltage, and $V_{L1}, V_{L2}, V_{LN}$ are control voltages of the switches.

In the following, the principle of an embodiment of the invention is described in further detail.

In the prior art, one digital word is inputted to a digital-to-analog converter-per every clock period. In other words, theoretically, the output of the digital-to-analog converter is an analog value that stays constant during a clock period. A result is a step-like analog signal causing image components to a signal spectrum.

In an embodiment of the invention, instead, the output of a converter is also synchronized in the middle of a clock period, in which case one or more values (interpolated sample values) are added between two steps of the step-like analog signal. Hence, an error between a generated signal and an ideal signal is smaller, which reduces image components.

In the case of one added value, the value has to be located in the middle of a step as precisely as possible in order not to generate an error. If more than one interpolation value is added, it has to be placed at even distances between the two steps.

The interpolation values are generated by dividing the converter into as many parts as the interpolation level (=the number of added interpolation values) is, and the different parts are synchronized with clock signals having phase shifts. An example: if the interpolation level is 2, the converter is divided into two parts, and one part is synchronized with the rising edge of an input data clock signal whereas another part is synchronized with the descending edge of the input data clock signal. When the interpolation level is 2, only two clock signals are needed, which means that in practice, the second clock signal can be obtained from the first one by inverting, since both clock signals have the same frequency.

Further examples: if the interpolation level is 4, the converter is divided into four parts, and four clock signals having phase differences of ¼ of a clock period are required. The different clock phases can be generated from a higher frequency reference clock by using, for example, a flip-flop divide-by-2 circuitry or several cascaded divide-by-2 circuitries, depending on the case. For example, by using one divide-by-2 circuitry it is possible to generate four clock phases. In such a case, the reference clock is twice the sampling clock. For practical implementations, it should be noticed that the interpolation level is preferably even, in other words, dividable by two. Additionally, it should be noticed that the number of data signals is not necessarily the same in all parts of the converter.

Figure 4:
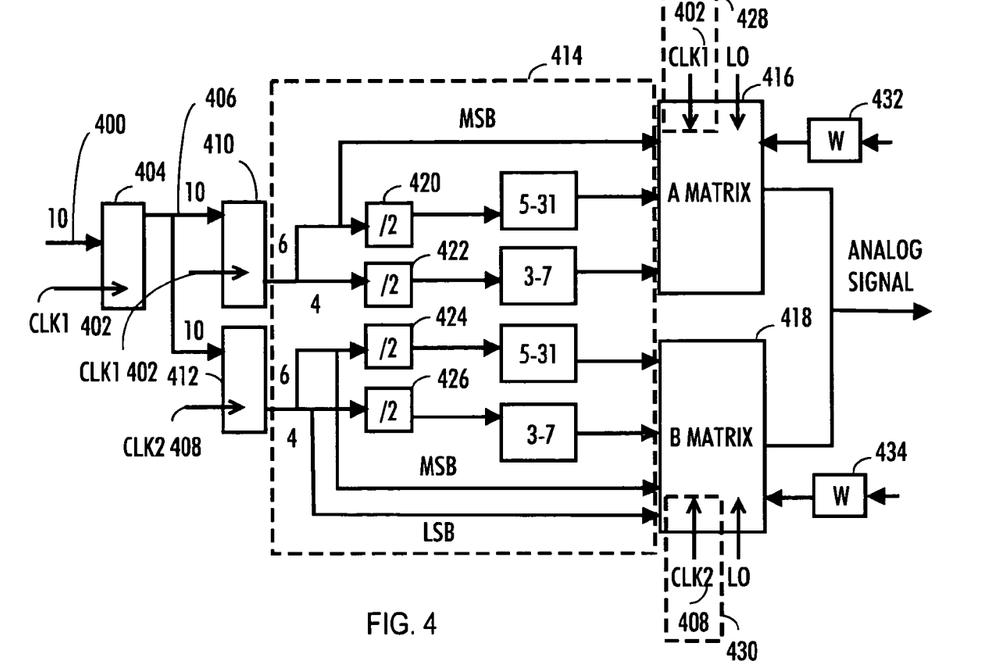
FIG. 4 illustrates an example of a converter providing interpolation.

Next, a device for digital-to-RF conversion according to an embodiment of the invention is explained by means of FIG. 4. A device for digital-to-analog conversion according to an embodiment of the invention includes interpolation which takes care of the attenuation of the closest image components, thus enabling prior art attenuation filters to be omitted. The device is typically a part of a radio transmitter.

The device, in this case a converter, includes means for providing a digital data signal. The generation of a digital data signal is well known in the prior art and thus not explained herein, neither are such means depicted in FIG. 4. The digital data signal is marked in FIG. 4 with reference number 400.

The converter also includes means 404, 406 for dividing the digital data signal into data signal groups. The number of data signal groups is typically even and the same as the wanted interpolation level. In this case, where interpolation by two is carried out, the phase difference is ½ of a clock period, which means that another data signal group is delayed by a half of a clock period.

The converter includes means for generating clock signals having different phases. The number of clock signals is the same as the number of data signal groups, that is to say, the same as the interpolation level. A reference clock signal is typically generated by using a crystal oscillator.

A required number of clock signals is provided of one being a reference clock signal and the others having appropriate phase shifts compared with the reference clock signal and to each other in order to generate interpolation values as described above.

No crystal oscillator is shown in FIG. 4, since it is prior art. One option for generating signals with different phases is to divide the reference clock signal. Generating signals having phase shifts compared with each other is also prior art and thus not explained herein.

The converter also includes means for synchronizing data signal groups by using clock signals. Typically, data is first synchronized by a reference clock signal and then, after grouping, the data is again synchronized but this time group-wise: a first group is synchronized with the reference clock, a second group with one phase-shifted clock, a third group with another phase-shifted clock, etc.

In the exemplary converter of FIG. 4, data is first synchronized by a reference clock (CLK1 402), in block 404, and then after grouping, a first grouped data signal is synchronized, in block 410, with the same clock (CLK1 402), and a second grouped data signal, in block 412, with an inverted clock (CLK2 408).

The converter includes means for conveying the synchronized data signal groups to conversion cell matrices, the number of conversion cell matrices being the same as the number of data signal groups (or interpolation level).

In FIG. 4, the conveying means are marked with reference number 414. In this example, the conveying means carries out a so-called thermometer decoding which is quite a typical way to divide data into smaller units for improving the linearity of a converter. In FIG. 4, numbers 3, 4, 5, 6, 7, 10 and 31 are bit numbers. Since thermometer decoding is prior art, it is not explained herein.

Most significant bits (MSB) are conveyed to all conversion matrices 416, 418 which include conversion cells in order to avoid a rounding error. The basic idea is to deliver at least one of lowest bits of the MSB block to all conversion cell matrices.

The current conveyed to conversion cell matrices also has to be adjusted, in this case halved. If the interpolation level (the number of added interpolation values) is higher, for instance 4, four current sources are provided each offering ¼ of total current.

Next, and example of weighting of current is explained in further detail. The example is depicted herein to further clarify the adjustment of current to be conveyed to conversion cell matrices. It is obvious for a person skilled in the art that the implementation of the current adjustment may vary case to case.

The current in the LSB sub-block is typically generated with parallel binary weighted units, whereas the current in the MSB sub-block is generated in a set of unary coded cells.

In the example, binary data includes 10 bits which is divided into two parts, namely MSB and LSB blocs. The MSB block includes 6 most significant bits and the LSB block 4 least significant bits.

The converter includes conversion cells having two different weights. The weight of LSB cell is 1 LSB and the weight of MSB cell is 16LSB. This is related to the MSB/LSB ratio which in this example is 6+4.

Since there are 63 MSB cells, one cell has to be split in order to obtain the same number of cells to both conversion cell matrices. This can be implemented in such a way that 64 conversion cell matrices are used, 62 of them have weight 16LSB and two have weight 8LSB.

The current is adjusted to the interpolation as follows: the current source having weight 8LSB is given a new weight obtained by dividing the weight by the used interpolation ratio to avoid rounding errors in output signal.

In the example depicted in FIG. 4, adjusting means 432, 434 weight current to be conveyed to conversion cell matrices.

The converter includes means 428, 430 for synchronizing each conversion cell matrix by using the clock signal with which the synchronized data signal group conveyed thereto was synchronized. In this example, two clock signals CLK1 402 and its inverted version CLK2 408 are used to synchronize conversion cell matrices 416, 418. Means 428, 430 are depicted with a square-like symbol to keep FIG. 4 clear. In practice, the means typically are conveying means for providing clock signals to the conversion cell matrices. The cells of the conversion cell matrix are synchronized by using different clock signals, which results in the different parts of the converter changing their states with different clock signal edges generating interpolation.

A local oscillator (LO) signal is also conveyed to the conversion matrices.

In FIG. 4, dividers 420, 422, 424, 426 are also depicted. In this example, a data signal is divided by two with the dividers because otherwise the same data should be split to two different paths, which would demand twice the number of conversion cells.

The device for digital-to-RF conversion according to an embodiment of the invention may also be implemented as a module or a chip set, such as an application-specific integrated circuit (ASIC).

Figure 5:
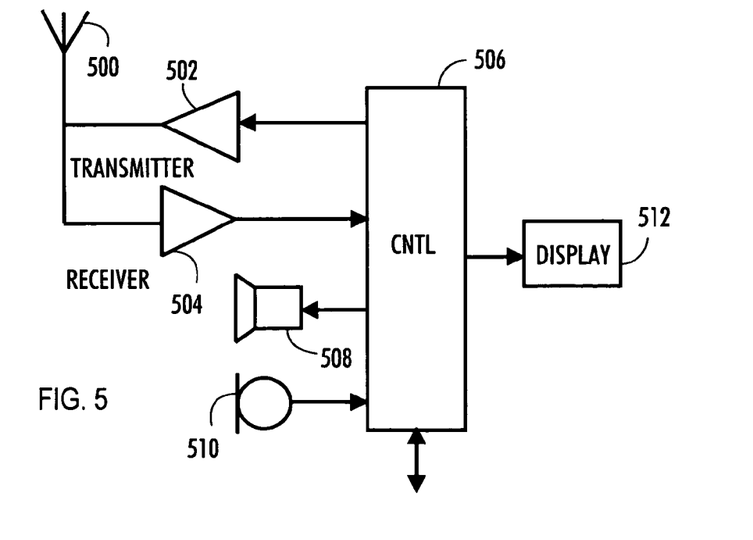
FIG. 5 illustrates an example of a user terminal.

FIG. 5 shows a simplified example of a user terminal whereto the embodiments of the invention can be applied. The user terminal may be a mobile telephone or a microcomputer, for example, without being restricted thereto. It is obvious to a person skilled in the art that the user terminal may also include elements other than those illustrated in FIG. 5.

The terminal comprises antenna 500 by which signals are both transmitted and received via a duplex filter.

The terminal further comprises transmitter front-end 502 to, for example, amplify and transmit a modulated signal to an antenna and receiver front-end 504 which amplifies a signal supplied from the antenna and down-converts the signal to a selected intermediate frequency or directly to base band.

The user terminal also comprises control block 506 comprising, for example, control and calculation means for controlling the operation of the different parts of the device, means for processing speech of a user or data generated by the user, such as a digital signal processing (DSP) processor comprising, for example, channel correction functions compensating for interference in the signal caused by a radio channel, A/D converters converting an analogue signal into a digital one by sampling and quantizing a base band signal, D/A converters converting a digital signal to an analogue one by a reverse method, filters at the receiver which filter frequencies outside a desired frequency band or which, in band-restricted systems, restrict the band width of an output at the transmitter, and coding and decoding means for both channel and speech coding.

Furthermore, in spread-spectrum systems, such as wide-band code division multiple access (WCDMA used in UMTS) systems, the spectrum of the signal is spread at the transmitter by means of a pseudorandom spreading code over a wide band and de-spread at the receiver, in an attempt to increase channel capacity.

The control block also comprises means for arranging the signal to be transmitted to conform with the air interface standard of the system used.

The device for digital-to-analog conversion according to an embodiment of the invention, may be located in the control block of the user terminal of the example as a part of a D/A converter or in connection to it.

The user interface of the device comprises loudspeaker or earpiece 508, microphone 510, display 512 and possibly a keypad and/or a joystick or a similar device. The user interface devices communicate with the control block.

Figure 6:
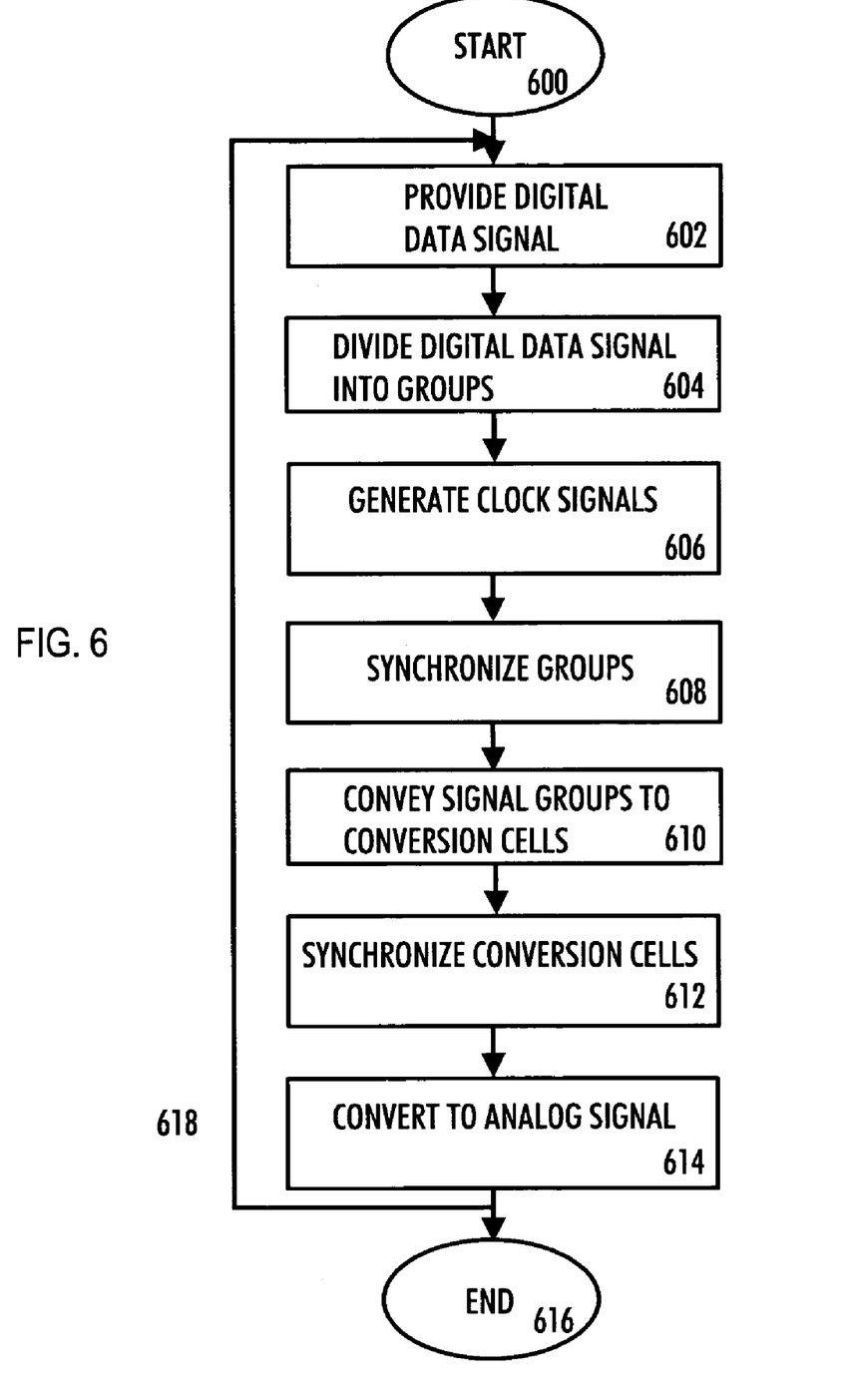
FIG. 6 is a flow chart.

Next, a data processing method in a communication device is explained. The method starts in block 600.

In block 602, a digital data signal is provided. The generation of a digital data signal is well known in the prior art, and is thus not explained herein.

In block 604, the digital data signal is divided into data signal groups. The number of data signal groups is typically even (and usually the same as the desired interpolation level).

In block 606, clock signals having different phases are generated. The number of clock signals is the same as the number of data signal groups. A reference clock signal is typically generated by using a local oscillator and phase differences are implemented by delaying appropriately the reference clock signal. Thus, the reference clock signal and a required number of its delayed versions are provided to generate interpolation values as described above.

In block 608, the data signal groups are synchronized by using the clock signals. Typically, the data is first synchronized by the reference clock signal and then, after grouping, the data is again synchronized but, this time group-wise: a first group is synchronized with the reference clock, a second group with one phase-shifted clock, a third group with another phase-shifted clock, etc.

In block 610, the synchronized data signal groups are conveyed to conversion cell matrices. The conversion cell matrices are prior art, as explained above. The number of conversion cell matrices is the same as the number of data signal groups.

In block 612, each conversion cell matrix is synchronized by using the clock signal with which the synchronized data signal group conveyed thereto was synchronized.

The cells of the conversion cell matrix are synchronized by using different clock signals with resulting in the different parts of the converter changing their states with different clock signal edges generating interpolation.

It should be noticed that most significant bits (MSB) are conveyed to all conversion matrices 416, 418 which include conversion cells in order to avoid a rounding error. The current conveyed to conversion cell matrices also has to be adjusted, in this case halved.

In block 614, the digital data signal is converted to an analog signal by using the conversion matrices. The digital-to-analog conversion by using conversion cells is well known to a person skilled in the art and is thus not explained herein.

The embodiment ends in block 616. The embodiment is typically repeated as long as there is data to be converted, which is marked with reference number 618.

Even though the invention has been described above with reference to an example according to the accompanying drawings, it is clear that the invention is not restricted thereto but it can be modified in several ways within the scope of the appended claims.

The invention claimed is:

1. A device for digital-to-radio frequency conversion, the device comprising:
   conversion cell matrices for digital-to-radio frequency conversion;
   the device configured to:
   provide a digital data signal;
   divide the digital data signal into data signal groups;
   generate clock signals, the clock signals having different phases, the number of clock signals being the same as the number of data signal groups;
   synchronize the data signal groups by using the clock signals;
   convey the synchronized data signal groups to the conversion cell matrices, the number of conversion cell matrices being the same as the number of data signal groups; and
   synchronize each conversion cell matrix by using the clock signal with which the synchronized data signal group conveyed thereto was synchronized for generating interpolation values.

2. The device of claim 1, further comprising: the number of data signal groups being two and the device comprising means for obtaining a second clock signal from a reference clock signal by inverting.

3. The device of claim 1, further comprising: a crystal oscillator for generating a reference clock signal, and means for generating a predetermined number of other clock signals having appropriate phase shifts compared to the reference clock signal and to each other.

4. The device of claim 1, further comprising a crystal oscillator for generating a reference clock signal, and means for generating a predetermined number of other clock signals having appropriate phase shifts compared to the reference clock signal and to each other, and means for synchronizing the digital data signal with the reference clock signal before grouping, and means for group-wise synchronizing the data signal groups by using all clock signals.

5. The device of claim 1, further comprising: means for conveying at least one of the lowest bits of a most significant bits (MSB) block to the conversion matrices and means for adjusting current conveyed to the conversion cell matrices by giving a new weight to a predetermined current source by dividing the original weight by used interpolation ratio in order to avoid rounding errors in output signal.

6. The device of claim 1, wherein the number of data signal groups is even.

7. A data processing method in a communication device, the method comprising:
   providing a digital data signal;
   dividing the digital data signal into data signal groups;
   generating clock signals, the clock signals having different phases, the number of clock signals being the same as the number of data signal groups;
   synchronizing the data signal groups by using the clock signals;
   conveying the synchronized data signal groups to conversion cell matrices, the number of conversion cell matrices being the same as the number of data signal groups;
   synchronizing each conversion cell matrix by using the clock signal with which the synchronized data signal group conveyed thereto was synchronized for generating interpolation values; and
   converting the digital data signal to an analog signal by using the conversion cell matrices.

8. The method of claim 7, further comprising: dividing the digital data signal into two groups and obtaining a second clock signal from a reference clock signal by inverting.

9. The method claim 7, further comprising: generating a reference clock signal by using a crystal oscillator and generating a predetermined number of other clock signals having appropriate phase shifts compared to the reference clock signal and to each other.

10. The method of claim 7, further comprising: generating a reference clock signal by using a crystal oscillator, and generating a predetermined number of other clock signals having appropriate phase shifts compared to the reference clock signal and to each other, and synchronizing the digital data signal with the reference clock signal before grouping and group-wise synchronizing the data signal groups by using all clock signals.

11. The method of claim 7, further comprising: conveying most significant bits (MSB) to the conversion matrices to avoid a rounding error.

12. The method of claim 7, wherein the number of data signal groups is even.

13. A chip set for digital-to-radio frequency conversion, the chip set comprising:
   conversion cell matrices for digital-to-radio frequency conversion;
   the chip set configured to:
   provide a digital data signal;
   divide the digital data signal into data signal groups;
   generate clock signals, the clock signals having different phases, the number of clock signals being the same as the number of data signal groups;
   synchronize the data signal groups by using the clock signals;
   convey the synchronized data signal groups to the conversion cell matrices, the number of conversion cell matrices being the same as the number of data signal groups; and
   synchronize each conversion cell matrix by using the clock synchronized data signal group conveyed thereto was synchronized for generating interpolation values.

14. The chip set of claim 13, further comprising: the number of data signal groups being two and the device comprising means for obtaining a second clock signal from a reference clock signal by inverting.

15. The chip set of claim 13, further comprising: a crystal oscillator for generating a reference clock signal and means for generating a predetermined number of other clock signals having appropriate phase shifts compared to the reference clock signal and to each other.

16. The chip set of claim 13, further comprising: a crystal oscillator for generating a reference clock signal and means for generating a predetermined number of other clock signals having appropriate phase shifts compared to the reference clock signal and to each other, and means for synchronizing the digital data signal with the reference clock signal before grouping and means for group-wise synchronizing the data signal groups by using all clock signals.

17. The chip set of claim 13, further comprising: means for conveying at least one of the lowest bits of a most significant bits (MSB) block to the conversion cell matrices, and means for adjusting current conveyed to the conversion cell matrices by giving a new weight to a predetermined current source by dividing the original weight by used interpolation ratio in order to avoid rounding errors in output signal.

18. The chip set of claim 13, wherein the number of data signal groups is even.

19. A transmitter for digital-to-radio frequency conversion, the transmitter comprising:
conversion cell matrices for digital-to-radio frequency conversion,
the transmitter configured to:
provide a digital data signal;
divide the digital data signal into data signal groups;
generate clock signals, the clock signals having different phases, the number of clock signals being the same as the number of data signal groups;
synchronize the data signal groups by using the clock signals;
convey the synchronized data signal groups to the conversion cell matrices, the number of conversion cell matrices being the same as the number of data signal groups; and
synchronize each conversion cell matrix by using the clock signal with which the synchronized data signal group conveyed thereto was synchronized for generating interpolation values.

20. The transmitter of claim 19, further comprising: the number of data signal groups being two and the device comprising means for obtaining a second clock signal from an reference clock signal by inverting.

21. The transmitter of claim 19, further comprising a crystal oscillator for generating a reference clock signal, and means for generating a predetermined number of other clock signals having appropriate phase shifts compared to the reference clock signal and to each other.

22. The transmitter of claim 19, further comprising: a crystal oscillator for generating a reference clock signal and means for generating a predetermined number of other clock signals having appropriate phase shifts compared to the reference clock signal and to each other, and means for synchronizing the digital data signal with the reference clock signal before grouping and means for group-wise synchronizing the data signal groups by using all clock signals.

23. The transmitter of claim 19, further comprising means for conveying at least one of the lowest bits of a most significant bits (MSB) block to the conversion cell matrices and means for adjusting current conveyed to the conversion cell matrices by giving a new weight to a predetermined current source by dividing the original weight by used interpolation ratio in order to avoid rounding errors in output signal.

24. The transmitter of claim 19, wherein the number of data signal groups is even.

25. A user terminal for digital-to-radio frequency conversion, the user terminal comprising:
conversion cell matrices for digital-to-radio frequency conversion,
the user terminal configured to:
provide a digital data signal;
divide the digital data signal into data signal groups;
generate clock signals, the clock signals having different phases, the number of clock signals being the same as the number of data signal groups;
synchronize the data signal groups by using the clock signals;
convey the synchronized data signal groups to the conversion cell matrices, the number of conversion cell matrices being the same as the number of data signal groups; and
synchronize each conversion cell matrix by using the clock synchronized data signal group conveyed thereto was synchronized for generating interpolation values.

26. The user terminal of claim 25, further comprising: the number of data signal groups being two and the device comprising means for obtaining a second clock signal from an reference clock signal by inverting.

27. The user terminal of claim 25, further comprising: a crystal oscillator for generating a reference clock signal, and means for generating a predetermined number of other clock signals having appropriate phase shifts compared to the reference clock signal and to each other.

28. The user terminal of claim 25, further comprising a crystal oscillator for generating a reference clock signal, and means for generating a predetermined number of other clock signals having appropriate phase shifts compared to the reference clock signal and to each other, and means for synchronizing the digital data signal with the reference clock signal before grouping and means for group-wise synchronizing the data signal groups by using all clock signals.

29. The user terminal of claim 25, further comprising: means for conveying at least one of the lowest bits of a most significant bits (MSB) block to the conversion cell matrices and means for adjusting current conveyed to the conversion cell matrices by giving a new weight to a predetermined current source by dividing the original weight by used interpolation ratio in order to avoid rounding errors in output signal.

30. The user terminal of claim 25, wherein the number of data signal groups is even.

31. A device for digital-to-radio frequency conversion, the device comprising:
conversion cell matrices for digital-to-radio frequency conversion;
means for providing a digital data signal;
means for dividing the digital data signal into data signal groups;
means for generating clock signals, the clock signals having different phases, the number of clock signals being the same as the number of data signal groups;
means for synchronizing the data signal groups by using the clock signals;
means for conveying the synchronized data signal groups to the conversion cell matrices, the number of conversion cell matrices being the same as the number of data signal groups; and
means for synchronizing each conversion cell matrix by using the clock signal with which the synchronized data signal group conveyed thereto was synchronized for generating interpolation values.

32. A chip set for digital-to-radio frequency conversion, the chip set comprising:
- conversion cell matrices for digital-to-radio frequency conversion;
- means for providing a digital data signal;
- means for dividing the digital data signal into data signal groups;
- means for generating clock signals, the clock signals having different phases, the number of clock signals being the same as the number of data signal groups;
- means for synchronizing the data signal groups by using the clock signals;
- means for conveying the synchronized data signal groups to the conversion cell matrices, the number of conversion cell matrices being the same as the number of data signal groups; and
- means for synchronizing each conversion cell matrix by using the clock signal with which the synchronized data signal group conveyed thereto was synchronized for generating interpolation values.

33. A transmitter for digital-to-radio frequency conversion, the transmitter comprising:
- conversion cell matrices for digital-to-radio frequency conversion;
- means for providing a digital data signal;
- means for dividing the digital data signal into data signal groups;
- means for generating clock signals, the clock signals having different phases, the number of clock signals being the same as the number of data signal groups;
- means for synchronizing the data signal groups by using the clock signals;
- means for conveying the synchronized data signal groups to the conversion cell matrices, the number of conversion cell matrices being the same as the number of data signal groups; and
- means for synchronizing each conversion cell matrix by using the clock signal with which the synchronized data signal group conveyed thereto was synchronized for generating interpolation values.

34. A user terminal for digital-to-radio frequency conversion, the user terminal comprising:
- conversion cell matrices for digital-to-radio frequency conversion;
- means for providing a digital data signal;
- means for dividing the digital data signal into data signal groups;
- means for generating clock signals, the clock signals having different phases, the number of clock signals being the same as the number of data signal groups;
- means for synchronizing the data signal groups by using the clock signals;
- means for conveying the synchronized data signal groups to the conversion cell matrices, the number of conversion cell matrices being the same as the number of data signal groups; and
- means for synchronizing each conversion cell matrix by using the clock signal with which the synchronized data signal group conveyed thereto was synchronized for generating interpolation values.

* * * * *

UNITED STATES PATENT AND TRADEMARK OFFICE
CERTIFICATE OF CORRECTION

PATENT NO. : 7,345,612 B2
APPLICATION NO. : 11/348837
DATED : March 18, 2008
INVENTOR(S) : Eloranta et al.

It is certified that error appears in the above-identified patent and that said Letters Patent is hereby corrected as shown below:

In the Specification:

Col. 4, line 47: "are lowpass-filtered" should read --are low-pass-filtered--.

Col. 4, line 53: "In adder 212, 1 and Q" should read --In adder 212, I and Q--.

In the Claims:

Claim 13, Col. 10, line 59: "clock synchronized" should be --clock signal with which the synchronized--.

Claim 25, Col. 12, line 18: "clock synchronized" should be --clock signal with which the synchronized--.

Signed and Sealed this

Fifth Day of August, 2008

JON W. DUDAS
*Director of the United States Patent and Trademark Office*